(12) United States Patent
Nguyen

(10) Patent No.: US 6,566,918 B1
(45) Date of Patent: May 20, 2003

(54) DIVIDE-BY-N CLOCK DIVIDER CIRCUIT WITH MINIMAL ADDITIONAL DELAY

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/210,938

(22) Filed: Aug. 2, 2002

Related U.S. Application Data

(63) Continuation-in-part of application No. 10/193,070, filed on Jul. 10, 2002, and a continuation-in-part of application No. 09/942,230, filed on Aug. 28, 2001, now Pat. No. 6,445,228.

(51) Int. Cl.$^7$ .............................................. H03K 21/38
(52) U.S. Cl. ..................... 327/115; 327/117; 377/47; 377/52
(58) Field of Search ................................ 327/113, 115, 327/117, 415, 198, 199; 377/47, 48, 52

(56) References Cited

U.S. PATENT DOCUMENTS

| | | | |
|---|---|---|---|
| 4,686,386 A | 8/1987 | Tadao | 327/143 |
| 5,065,415 A | * 11/1991 | Yamashita | 377/52 |
| 5,675,273 A | 10/1997 | Masleid | 327/156 |
| 5,684,418 A | 11/1997 | Yanagiuchi | 327/99 |
| 5,914,996 A | 6/1999 | Huang | 327/115 |
| 6,061,418 A | 5/2000 | Hassoun | 377/47 |
| 6,133,796 A | 10/2000 | Monk | 327/115 |
| 6,239,627 B1 | 5/2001 | Brown et al. | 327/116 |

FOREIGN PATENT DOCUMENTS

| | | |
|---|---|---|
| EP | 0 385 567 A2 | 5/1990 |
| JP | 0236856 | * 3/1990 |

* cited by examiner

*Primary Examiner*—Dinh T. Le
(74) *Attorney, Agent, or Firm*—Lois D. Cartier

(57) ABSTRACT

A divide-by-N clock divider circuit adds little additional delay on the clock path. N can be any integer, and the value of N does not affect the clock path delay. The divide-by-N clock divider circuits of the invention include a control circuit and a logical NOR circuit, where the control circuit is clocked by an input clock signal and the NOR circuit combines the output signal of the control circuit with the input clock signal. The control circuit acts as a filter, selecting pulses from the input clock signal to be passed to the output terminal. By selecting one out of every N input clock pulses, a divide-by-N clock divider is implemented. Because no decode logic is included in the clock path, the through-delay of the clock divider circuit is small. In some embodiments, the value of N is programmable. In some embodiments, optional duty cycle correction is available.

30 Claims, 9 Drawing Sheets

DIVIDE-BY-N CLOCK DIVIDER CIRCUIT WITH MINIMAL ADDITIONAL DELAY

This application is a continuation-in-part of Ser. No. 10/193,070 filed Jul. 10, 2002 and is a continuation-in-part of Ser. No. 09/942,230 filed Aug. 28, 2001 now U.S. Pat. No. 6,445,228.

FIELD OF THE INVENTION

The invention relates to clocking circuits for digital systems. More specifically, the present invention relates to a programmable divide-by-N clock divider circuit with optional duty cycle correction that adds only a minimal delay to the clock path.

BACKGROUND OF THE INVENTION

Digital circuits such as board level systems and integrated circuit (IC) devices, including programmable logic devices (PLDs), and microprocessors, use clocking signals for a variety of reasons. For example, synchronous systems use global clock signals to synchronize various circuits across the board or IC device.

However, as the complexity of digital circuits increases, clocking schemes for synchronous systems become more complicated. Many complex digital circuits such as PLDs and microprocessors use multiple clock signals at different frequencies. For example, in some PLDs, some of the programmable logic blocks can be operated at a first clock frequency while other logic blocks are operated at a second clock frequency.

Multiple clock generating circuits can be used to generate the multiple clock signals. However, clock generating circuits typically consume a large amount of device or board space. Therefore, most systems use one clock generating circuit to generate a first clock signal and a specialized circuit to derive other clock signals from the first clock signal. For example, clock dividers are often used to generate clock signals of lower frequency from an input clock signal.

FIG. 1 shows a conventional divide-by-four clock divider 100 that receives an input clock signal CKIN and generates a divide-by-two clock signal CLKD2 and a divide-by-four clock signal CLKD4. (In the present specification, the same reference characters are used to refer to terminals, signal lines, and their corresponding signals.) Clock divider 100 comprises a conventional 2-bit counter 110. Input clock signal CKIN is applied to the clock terminal of 2-bit counter 110. Counter 110 drives clock signals CLKD2 and CLKD4 on output terminals 00 and 01, respectively. Output terminals 00 and 01 provide the least significant and most significant bits of 2-bit counter 110, respectively.

FIG. 1A is a timing diagram for clock divider 100 of FIG. 1. As can easily be seen from FIG. 1A, if input clock signal CKIN has a clock period P, then divide-by-two clock signal CLKD2 has a clock period of 2P. Similarly, divide-by-four clock signal CLKD4 has a period of 4P. Thus, the frequency of clock signal CLKD2 is half the frequency of input clock signal CKIN, and the frequency of clock signal CLKD4 is one-fourth the frequency of signal CKIN.

Some known clock dividers combine the output signals of a counter to generate other clock signals. For example, FIG. 2 shows a known divide-by-four clock divider circuit. A timing diagram for the circuit of FIG. 2 is shown in FIG. 2A.

Clock divider 200 includes toggle flip-flops 201 and 202, AND gate 203, and OR gate 204. AND gate 203 combines signals DIVEN (a divider enable input signal) and CKIN (the input clock signal) to provide signal CK. Input clock signal CKIN also drives clock terminal C of flip-flop 201, while the output terminal Q of flip-flop 201 provides signal DIV2. Signal DIV2 drives clock terminal C of flip-flop 202, while the output terminal Q of flip-flop 202 provides signal DIV4. The reset terminals R of flip-flops 201 and 202 are driven by divider enable signal DIVEN. OR gate 204 is driven by signals CK, DIV2, and DIV4, and provides output signal CKOUT.

As shown in FIG. 2A, on the first CKIN clock edge after divider enable signal DIVEN goes high, signals DIV2 and DIV4 both go high. If the period of signal CKIN is denoted as P, then signal DIV2 has a period of 2P, and signal DIV4 has a period of 4P. Signal CKOUT follows signal CKIN one out of every four input clock periods. During the other three clock periods, signal CKOUT is high.

Clock divider 200 of FIG. 2 combines the two flip-flop outputs DIV2 and DIV4 using a combinatorial function (OR). Essentially, the flip-flop output signals are decoded and combined with the clock input signal CKIN. This concept can be extended to create larger counters. For example, adding another flip-flop with a clock terminal C driven by signal DIV4 and providing an output signal DIV8, and ORing the DIV8 signal with DIV2 and DIV4, creates a divide-by-eight counter. Note that this type of counter is limited to divisors that are powers of two.

Note further that the delay from the input clock signal CKIN to the output clock signal CKOUT includes the combinatorial-logic (e.g., OR gate 204) used to decode the flip-flop outputs. This delay can be significant, particularly when wider OR gates are required. Further, when the counter becomes too large, it is impractical to implement the resulting wide OR gate using CMOS logic.

Therefore, it is desirable to provide a clock divider circuit that has a fast through-delay, e.g., does not require wide combinatorial logic functions in the clock path. It is further desirable to provide a clock divider circuit that supports divisors other than the powers of two.

SUMMARY OF THE INVENTION

The invention provides a divide-by-N clock divider circuit that adds little additional delay on the clock path. N can be any integer, and the value of N does not affect the clock path delay. The divide-by-N divider circuits of the invention include a control circuit and a logical NOR circuit, where the control circuit is clocked by an input clock signal and the NOR circuit combines the input clock signal with the output signal of the control circuit. The control circuit acts as a filter, selecting pulses from the input clock signal to be passed to the output terminal. By selecting one out of every N input clock pulses, a divide-by-N clock divider is implemented. In some embodiments, the value of N is programmable. In some embodiments, optional duty cycle correction is available.

According to one embodiment of the invention, a clock divider circuit includes a control circuit and a NOR circuit. The control circuit includes N−1 (N minus one) flip-flops coupled in series, i.e., a data output terminal of each flip-flop drives a data input terminal of the next flip-flop in the series (possibly with intervening logic). An input clock signal drives the clock terminal of each flip-flop. The last flip-flop in the series drives the data input terminal of the first flip-flop in the series. The logical NOR circuit is driven by the last flip-flop and by the input clock signal, and provides the output clock signal of the clock divider circuit.

In some embodiments, a divider enable signal is provided. When the divider is disabled, the flip-flops are initialized to known values. In some of these embodiments, the flip-flops are reset flip-flops and the known values are all zero.

Some embodiments include an optional duty cycle correction feature. In one such embodiment, the clock divider circuit includes a counter circuit and a multiplexer circuit. The counter circuit provides a divide-by-M clock signal, where M is an integral multiple of two. A duty cycle correction enable signal controls the multiplexer circuit to select between the outputs of the control circuit and the counter circuit. In some embodiments, the counter circuit is a Gray code counter, i.e., the counter implements a Gray code, wherein only one bit changes in response to any given clock edge.

Some embodiments of the invention include a programmable divisor feature. One such embodiment includes a programmable control circuit and a NOR circuit. The programmable control circuit includes a plurality of flip-flops coupled in series, including a first flip-flop and a last flip-flop. An input clock signal drives the clock terminal of each flip-flop. The last flip-flop drives the data input terminal of the first flip-flop. The logical NOR circuit is driven by the last flip-flop and by the input clock signal, and provides the output clock signal of the clock divider circuit. A multiplexer circuit is inserted between the first and last flip-flops, the multiplexer circuit having two data input terminals driven by the last flip-flop and another of the flip-flops, an output terminal driving the last flip-flop, and a divisor select input terminal.

Many other embodiments are possible, some of which are shown in the accompanying figures and described in the Detailed Description of the Drawings section, below.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific examples are set forth to provide a more thorough understanding of the present invention. These specific examples include numerous details specific to these examples. However, it will be apparent to one skilled in the art that the present invention may be practiced without these specific details.

Figure 3:
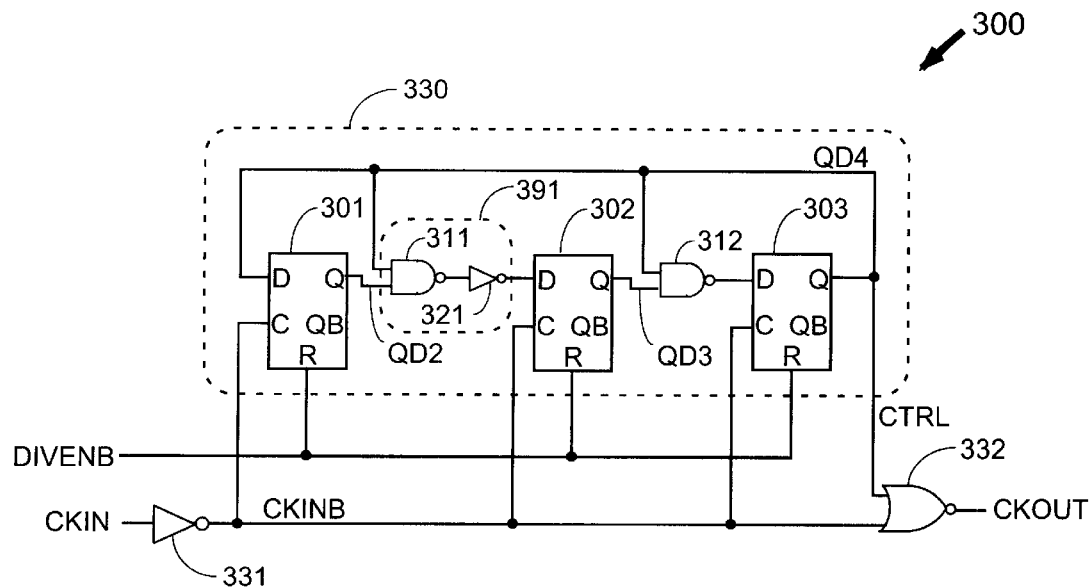
FIG. 3 is a circuit diagram of a divide-by-four clock divider circuit according to one embodiment of the invention.

FIG. 3 shows a divide-by-four clock divider circuit 300 according to one embodiment of the invention. Clock divider circuit 300 includes a control circuit 330, an inverter 331, and a logical NOR circuit 332 (implemented in this embodiment as a 2-input NOR gate). The input clock signal CKIN drives inverter 331 to provide signal CKINB, which in turn drives NOR gate 332, which provides the output clock signal CKOUT. An output signal CTRL from control circuit 330 also drives NOR gate 332. In some embodiments (not shown), inverter 331 is omitted.

Control circuit 330 includes three flip-flops 301–303, logical AND circuit 391 (implemented in this embodiment as a NAND gate 311 followed by an inverter 321), and logical NAND circuit 312 (implemented in this embodiment as a NAND gate). The clock terminal of each flip-flop 301–303 is driven by signal CKINB. Signal QD2, the Q data output of flip-flop 301, drives AND circuit 391, as does signal QD4, the Q data output of flip-flop 303. AND circuit 391 drives the D data input of flip-flop 302. Signal QD3, the Q data output of flip-flop 302, drives NAND circuit 312, as does signal QD4. NAND circuit 312 drives the D data input of flip-flop 303. Signal QD4 also drives the D data input of flip-flop 301 and supplies the output signal CTRL from control circuit 330.

In the embodiment of FIG. 3, all of the flip-flops have initialization input terminals, in this case reset terminals. (In other embodiments, some or all of the flip-flops have set initialization terminals, both set and reset initialization terminals, or no initialization terminals. When the flip-flops are not initialized, the control circuit can begin operating in any state. Therefore, embodiments with flip-flop initialization terminals are preferred.) The reset input terminals are all coupled to receive a divider enable signal DIVENB. When signal DIVENB is high, all flip-flops are reset, i.e., signals QD2, QD3, and QD4 are all low. When signal DIVENB goes low, the flip-flops respond to falling edges of clock signal CKIN (rising edges on clock signal CKINB) by changing state as dictated by the circuit connections shown in FIG. 3.

Figure 3A:
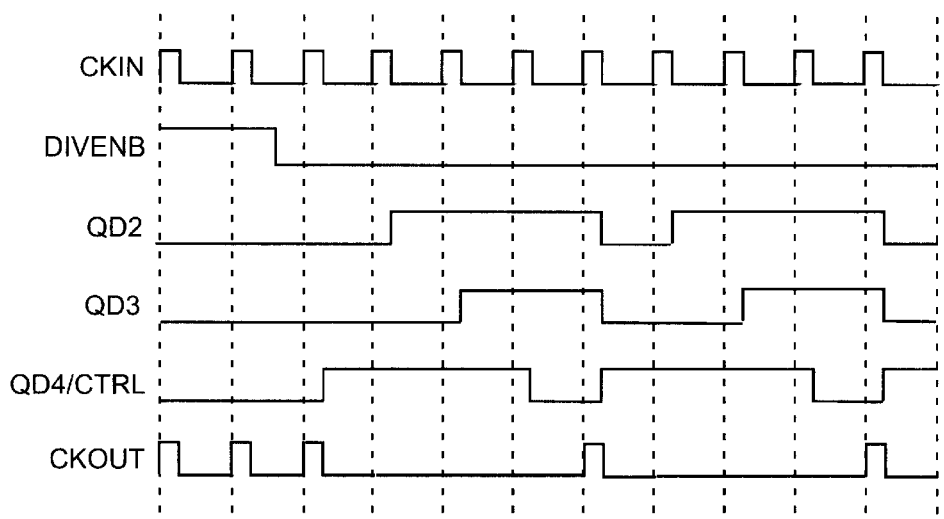
FIG. 3A is a timing diagram for the clock divider circuit of FIG. 3.

Clock divider circuit 300 of FIG. 3 functions as shown in FIG. 3A. Note that high pulses on input clock signal CKIN are filtered by signal CTRL from the control circuit, using NOR gate 332. Only when signal CTRL is low are high pulses on input clock signal CKIN passed to the output terminal CKOUT.

Figure 1:
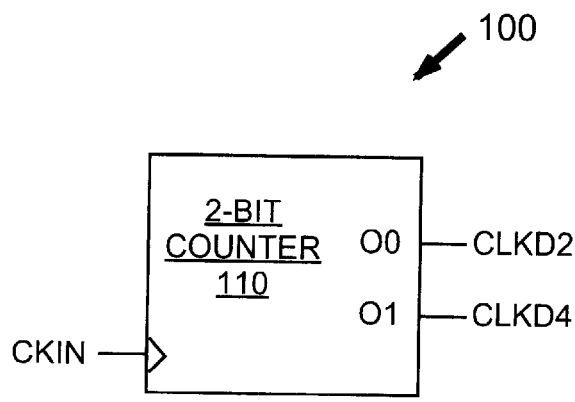
FIG. 1 shows a two-bit counter that is often used as a clock divider circuit.
Figure 1A:
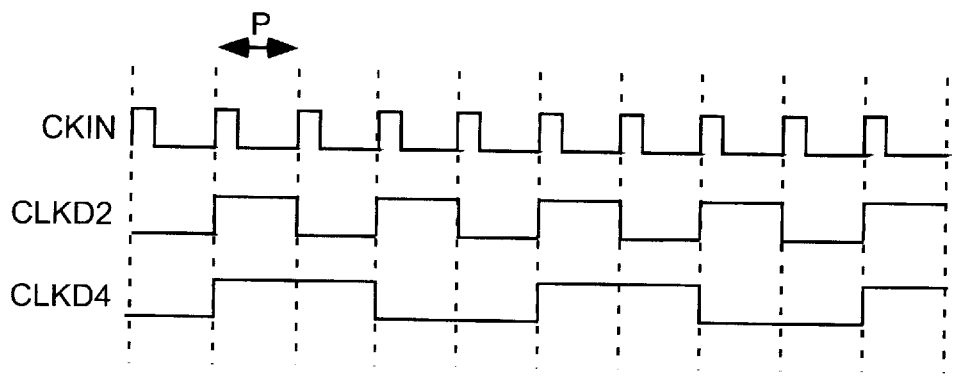
FIG. 1A is a timing diagram for the two-bit counter of FIG. 1.
Figure 2:
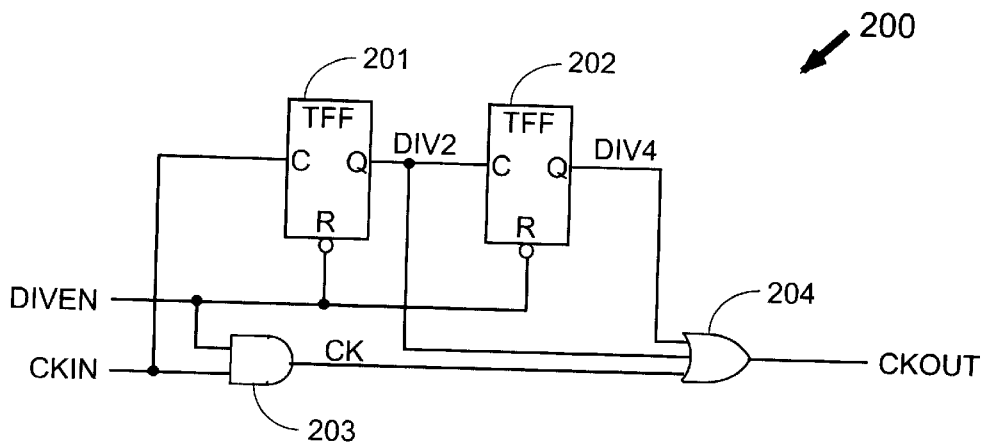
FIG. 2 is a circuit diagram of a known divide-by-four clock divider circuit.
Figure 2A:
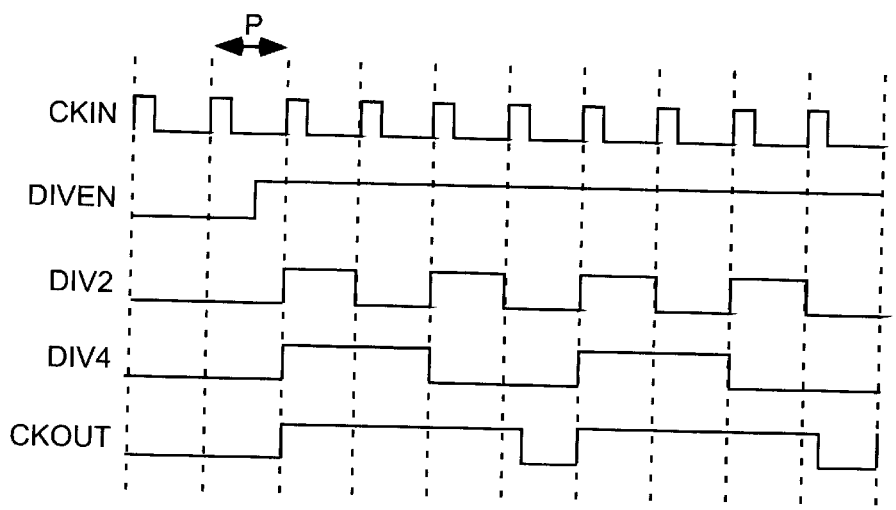
FIG. 2A is a timing diagram for the clock divider circuit of FIG. 2.

Unlike the prior art circuits of FIGS. 1 and 2, the clock divider circuits of the invention are not limited to divisors that are powers of two.

Figure 4:
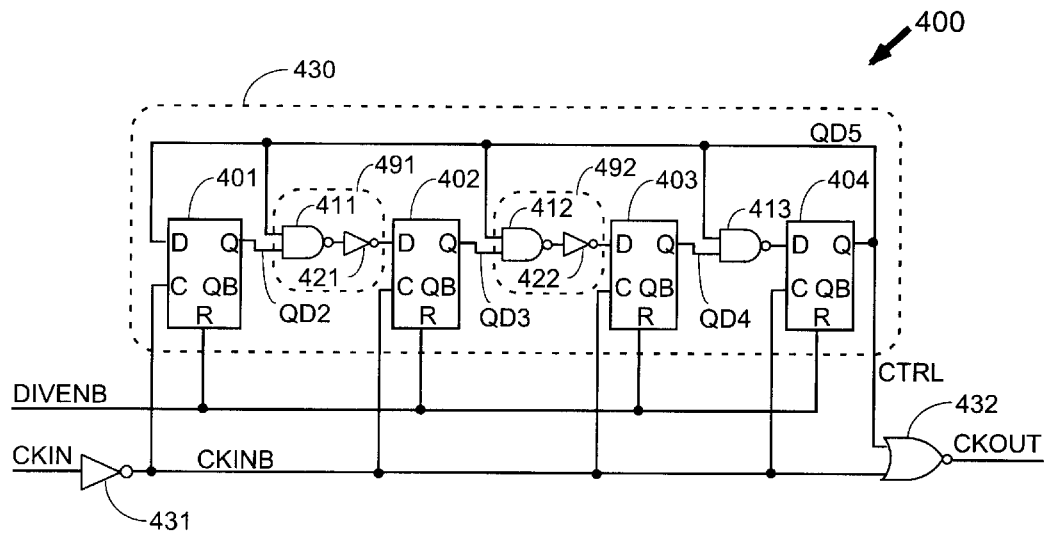
FIG. 4 is a circuit diagram of a divide-by-five clock divider circuit according to one embodiment of the invention.

FIG. 4 shows a divide-by-five clock divider circuit according to an embodiment of the invention. Clock divider circuit 400 is similar to clock divider circuit 300 of FIG. 3, except for the addition of another AND circuit and flip-flop in the control circuit. This additional circuitry gives a divisor of five, instead of a divisor of four as in clock divider circuit 300.

Clock divider circuit 400 includes a control circuit 430, an inverter 431, and a logical NOR circuit 432 (implemented in this embodiment as a 2-input NOR gate). The input clock signal CKIN drives inverter 431 to provide signal CKINB, which in turn drives NOR gate 432, which provides the output clock signal CKOUT. An output signal CTRL from control circuit 430 also drives NOR gate 432. In some embodiments (not shown), inverter 431 is omitted.

Control circuit 430 includes four flip-flops 401–404, logical AND circuits 491–492 (implemented in this embodiment as NAND gates 411–412 followed by inverters 421–422), and logical NAND circuit 413 (implemented in this embodiment as a NAND gate). The clock terminal of each flip-flop 401–404 is driven by signal CKINB. In the pictured embodiment, each of the flip-flops 401–404 has a reset initialization terminal coupled to receive a divider enable signal DIVENB, which functions as described in reference to FIG. 3.

Signal QD2, the Q data output of flip-flop. 401, drives AND circuit 491, as does signal QD5, the Q data output of flip-flop 404. AND circuit 491 drives the D data input of flip-flop 402. Signal QD3, the Q data output of flip-flop 402, drives AND circuit 492, as does signal QD5. AND circuit 492 drives the D data input of flip-flop 403. Signal QD4, the Q data output of flip-flop 403, drives NAND gate 413, as does signal QD5. NAND circuit 413 drives the D data input of flip-flop 404. Signal QD5 also drives the D data input of flip-flop 401 and supplies the output signal CTRL from control circuit 430.

In a fashion similar to the clock divider circuit of FIG. 3, high pulses on input clock signal CKIN are filtered by signal CTRL from the control circuit, using NOR gate 432. Only when signal CTRL is low are high pulses on input clock signal CKIN passed to the output terminal CKOUT. However, in this embodiment signal CTRL is low only every fifth clock cycle of signal CKIN. Therefore, clock divider circuit 400 of FIG. 4 is a divide-by-five clock divider.

To implement divisors greater than five, simply insert additional flip-flops and logical AND circuits (e.g., similar to flip-flop 402 and AND circuit 492) into the control circuit series chain. The total number of flip-flops in the series is one less than the desired divisor, i.e., to implement a divisor of N, a chain of N–1 (N minus one) flip-flops are needed.

Figure 5:
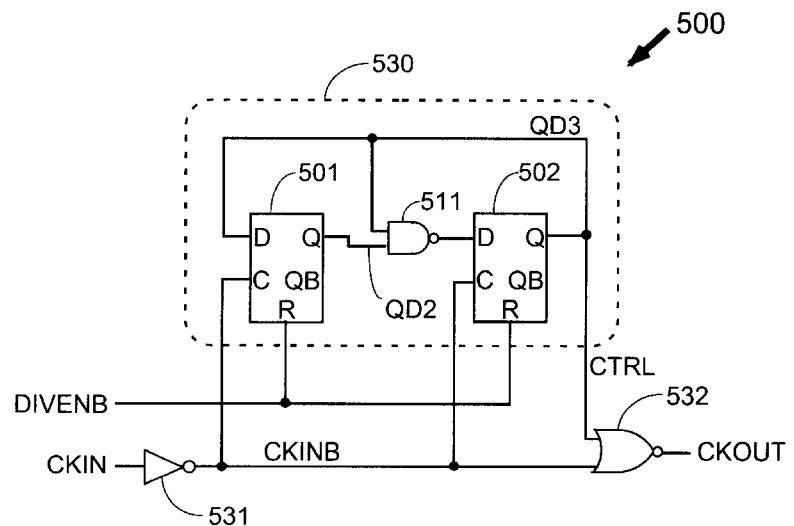
FIG. 5 is a circuit diagram of a divide-by-three clock divider circuit according to one embodiment of the invention.

FIG. 5 shows one example of a divide-by-three clock divider circuit according to one embodiment of the invention. Clock divider circuit 500 includes a control circuit 530, an inverter 531, and a logical NOR circuit 532 (implemented in this embodiment as a 2-input NOR gate). The input clock signal CKIN drives inverter 531 to provide signal CKINB, which in turn drives NOR gate 532, which provides the output clock signal CKOUT. An output signal CTRL from control circuit 530 also drives NOR gate 532. In some embodiments (not shown), inverter 531,is omitted.

Control circuit 530 includes two flip-flops 501–502 and logical NAND circuit 511 (implemented in this embodiment as a NAND gate). The clock terminal of each flip-flop 501–502 is driven by signal CKINB. In the pictured embodiment, each of the flip-flops 501–502 has a reset initialization terminal coupled to receive a divider enable signal DIVENB, which functions as described in reference to FIG. 3.

Signal QD2, the Q data output of flip-flop 501, drives NAND circuit 511, as does signal QD3, the Q data output of flip-flop 502. AND circuit 511 drives the D data input of flip-flop 502. Signal QD3 also drives the D data input of flip-flop 501 and supplies the output signal CTRL from control circuit 530.

Figure 6:
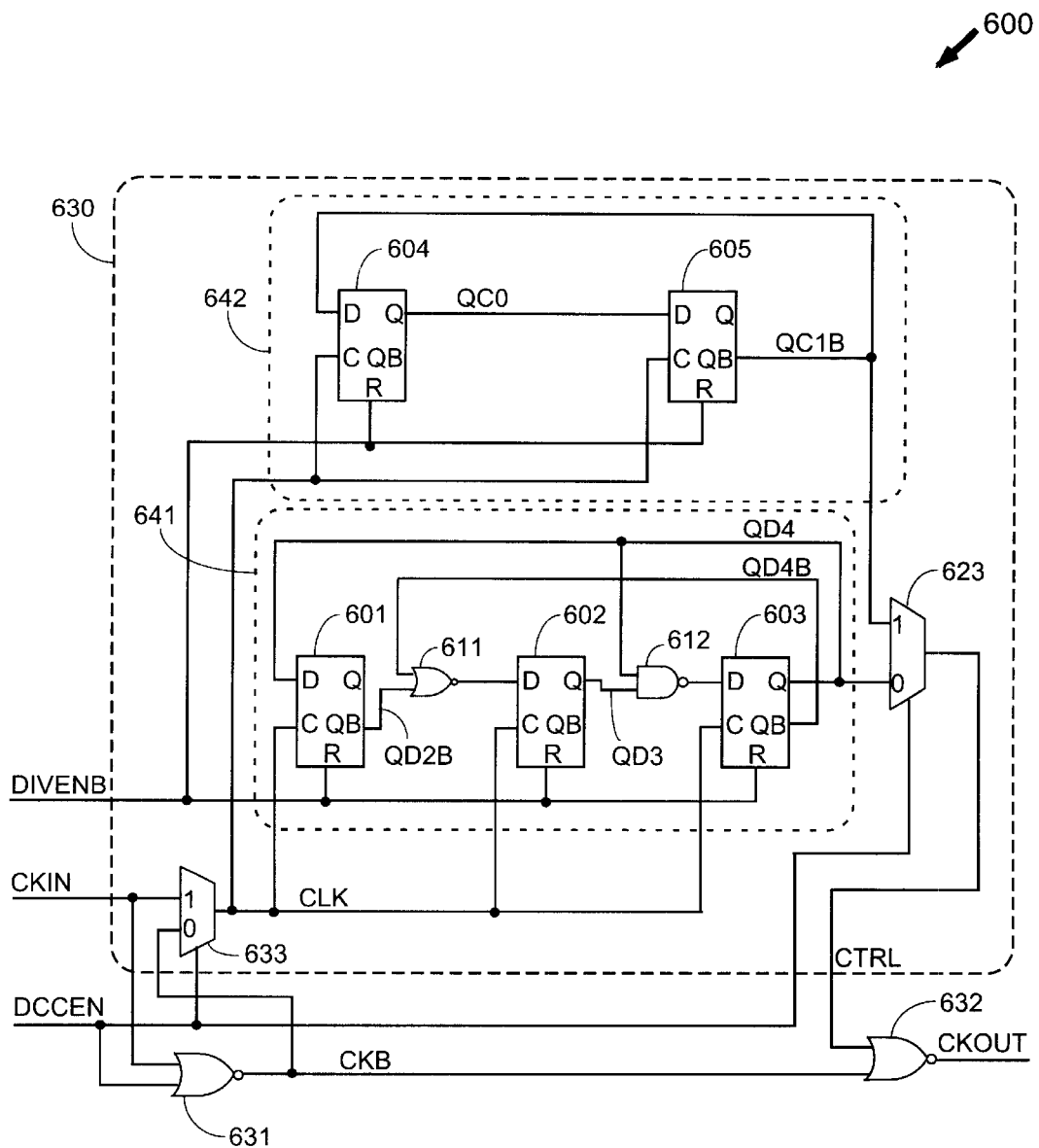
FIG. 6 is a circuit diagram of a divide-by-four clock divider circuit with optional duty cycle correction according to one embodiment of the invention.

FIG. 6 illustrates one embodiment of the invention having optional duty cycle correction. Clock divider circuit 600 of FIG. 6 is a divide-by-four clock divider.

In clock divider circuit 600, the control circuit 630 includes two different sub-circuits, either of which can be selected to provide the control signal CTRL used to filter the input clock pulses. A first sub-circuit 641 is an alternative embodiment of control circuit 330, shown in FIG. 3. When the first sub-circuit is selected, output clock signal CKOUT does not include duty cycle correction. A second sub-circuit 642 implements a counter, in the pictured embodiment a Gray code counter. When the second sub-circuit is selected, output clock signal CKOUT includes duty cycle correction. The selection between the two sub-circuits is made using a multiplexer 623 and is controlled by a duty cycle correction enable signal DCCEN.

Clock divider circuit 600 includes a control circuit 630 and logical NOR circuits 631–632 (implemented in this embodiment as 2-input NOR gates). NOR gate 631 is driven by input clock signal CKIN and duty cycle correction enable signal DCCEN, and provides inverted clock signal CKB. NOR gate 632 is driven by signal CKB and by output signal CTRL from control circuit 630, and provides the output clock signal CKOUT.

Control circuit 630 includes first and second sub-circuits 641–642 and multiplexer circuit 623. Multiplexer circuit 623 has "0" and "1" data input terminals coupled to receive signals QD4 and QC1B, respectively, from sub-circuits 641–642. When signal DCCEN is high (i.e., duty cycle correction is enabled), signal QC1B is passed to control circuit output signal CTRL. When signal DCCEN is low (i.e., duty cycle correction is disabled), signal QD4 is passed to control circuit output signal CTRL.

Control circuit 630 also includes multiplexer circuit 633, which selects between signals CKIN and CKB under control of signal DCCEN. When signal DCCEN is high.(i.e., duty cycle correction is enabled), signal CKIN is passed to node CLK. When signal DCCEN is low (i.e., duty cycle correction is disabled), signal CKB is passed to node CLK. Node CLK provides the clock signal for each of sub-circuits 641 and 642.

First sub-circuit 641 is an alternative embodiment of control circuit 330, shown in FIG. 3. Sub-circuit 641 can be used in FIG. 3 in place of control circuit 330, and control circuit 330 of FIG. 3 can be used in FIG. 6 in place of sub-circuit 641. Other variations on this circuit will be apparent to those of skill in the relevant arts after studying the present specification and figures. These variations are also encompassed by the spirit and scope of the present invention.

Sub-circuit 641 includes three flip-flops 601–603, logical NOR circuit 611 (implemented in this embodiment as a NOR gate), and logical NAND circuit 612 (implemented in this embodiment as a NAND gate). Signal QD2B, the QB (complement) data output of flip-flop 601, drives NOR circuit 611, as does signal QD4B, the QB data-output of flip-flop 603. NOR circuit 611 drives the D data input of flip-flop 602. Signal QD3, the Q data output of flip-flop 602, drives NAND circuit 612, as does signal QD4, the Q (true) data output of flip-flop 603. NAND circuit 612 drives the D data input of flip-flop 603. Signal QD4 also drives the D data input of flip-flop 601 and supplies one of the input signals to multiplexer 623.

Second sub-circuit 642 is a counter circuit. In the pictured embodiment, the counter circuit is a Gray code counter implementing the sequence shown in Table 1. However, any type of counter having the desired functionality can be used. In other embodiments, other types of counters are used. For example, two-bit counter 110 of FIG. 1 can be used, with divide-by-four output signal CLKD4 being provided to multiplexer circuit 623. As another example, the counter formed by flip-flops 201 and 202 in FIG. 2 could be used to provide second sub-circuit 642, with signal DIV4 being provided to multiplexer circuit 623.

TABLE 1

| Current Value | | | Next Value | |
|---|---|---|---|---|
| DIVENB | OC1B | OC0 | OC1B | OC0 |
| 1 | 1 | 0 | 1 | 0 |
| 0 | 1 | 0 | 1 | 1 |
| 0 | 1 | 1 | 0 | 1 |
| 0 | 0 | 1 | 0 | 0 |
| 0 | 0 | 0 | 1 | 0 |

Second sub-circuit 642 includes two flip-flops 604–605. Signal,QC0, the Q data output of flip-flop 604, drives the D data input of flip-flop 605. Signal QC1B, the QB (complement) data output of flip-flop 605, drives the D data input of flip-flop 604 and also provides one of the input signals to multiplexer circuit 623.

In the embodiment of FIG. 6, the clock terminal of each flip-flop is driven by signal CLK. Additionally, all of the flip-flops have initialization input terminals, in this case reset terminals. (In other embodiments, some or all of the flip-flops have set initialization terminals, both set and reset initialization terminals, or no initialization terminals.) The reset input terminals are all coupled to receive a divider enable signal DIVENB. When signal DIVENB is high, all flip-flops are reset. When signal DIVENB goes low, the flip-flops respond to rising edges on clock signal CLK by changing state as dictated by the circuit connections shown in FIG. 6.

Figure 6A:
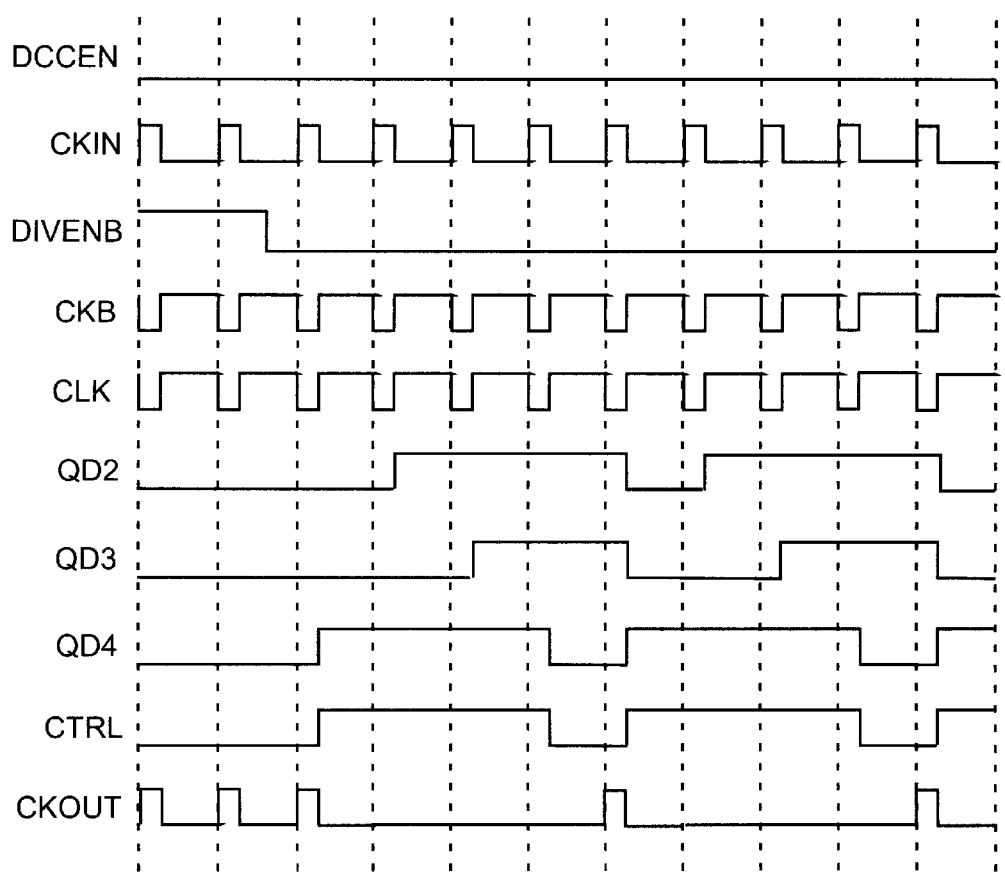
FIG. 6A is a timing diagram for the clock divider circuit of FIG. 6 when duty cycle correction is disabled.

FIG. 6A is a timing diagram for the circuit of FIG. 6 when duty cycle correction is disabled. Signal DCCEN is low, therefore, multiplexer circuit 623 passes the output QD4 of sub-circuit 641 to signal CTRL. Sub-circuit 641 functions in a manner similar to control circuit 330 of FIG. 3. Comparing FIG. 6A to FIG. 3A, it is clear that the two timing diagrams are the same.

Returning to FIG. 6A, signal CTRL follows signal QD4 because of the low value of signal DCCEN. Because signal DCCEN is low, NOR circuit 631 simply inverts the value of input clock signal CKIN and passes the resulting signal CKB to NOR circuit 632. Using NOR circuit 632, signal CTRL acts as a filter and passes low pulses on signal CKB (high pulses on signal CKIN) only when signal CTRL is low.

Figure 6B:
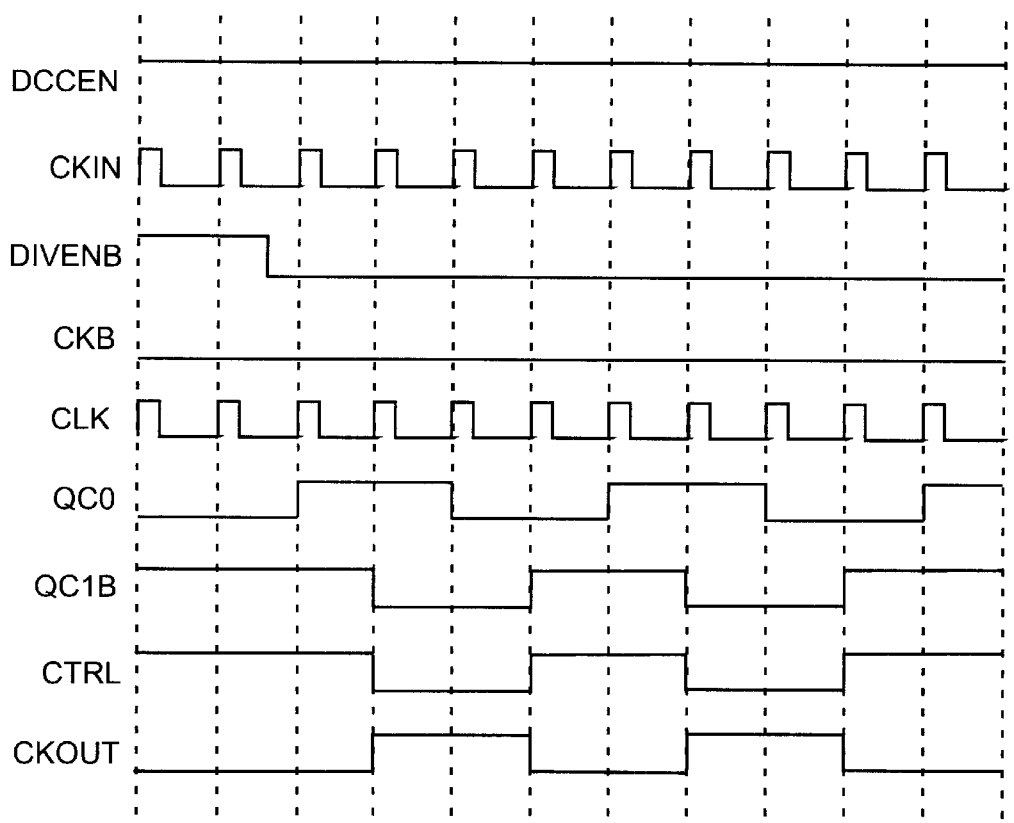
FIG. 6B is a timing diagram for the clock divider circuit of FIG. 6 when duty cycle correction is enabled.

FIG. 6B is a timing diagram for the circuit of FIG. 6 when duty cycle correction is enabled. Signal DCCEN is high, therefore, multiplexer circuit 623 passes the output QC1B of sub-circuit 642 to signal CTRL. Sub-circuit 642 functions as shown above in Table 1. Signal QC1B has a clock period of four times the input clock period and is duty cycle corrected, as shown in FIG. 6B. Because signal DCCEN is high, signal CKB is low. Therefore NOR circuit 632 simply inverts signal CTRL and provides the inverted signal as output signal CKOUT.

Figure 7:
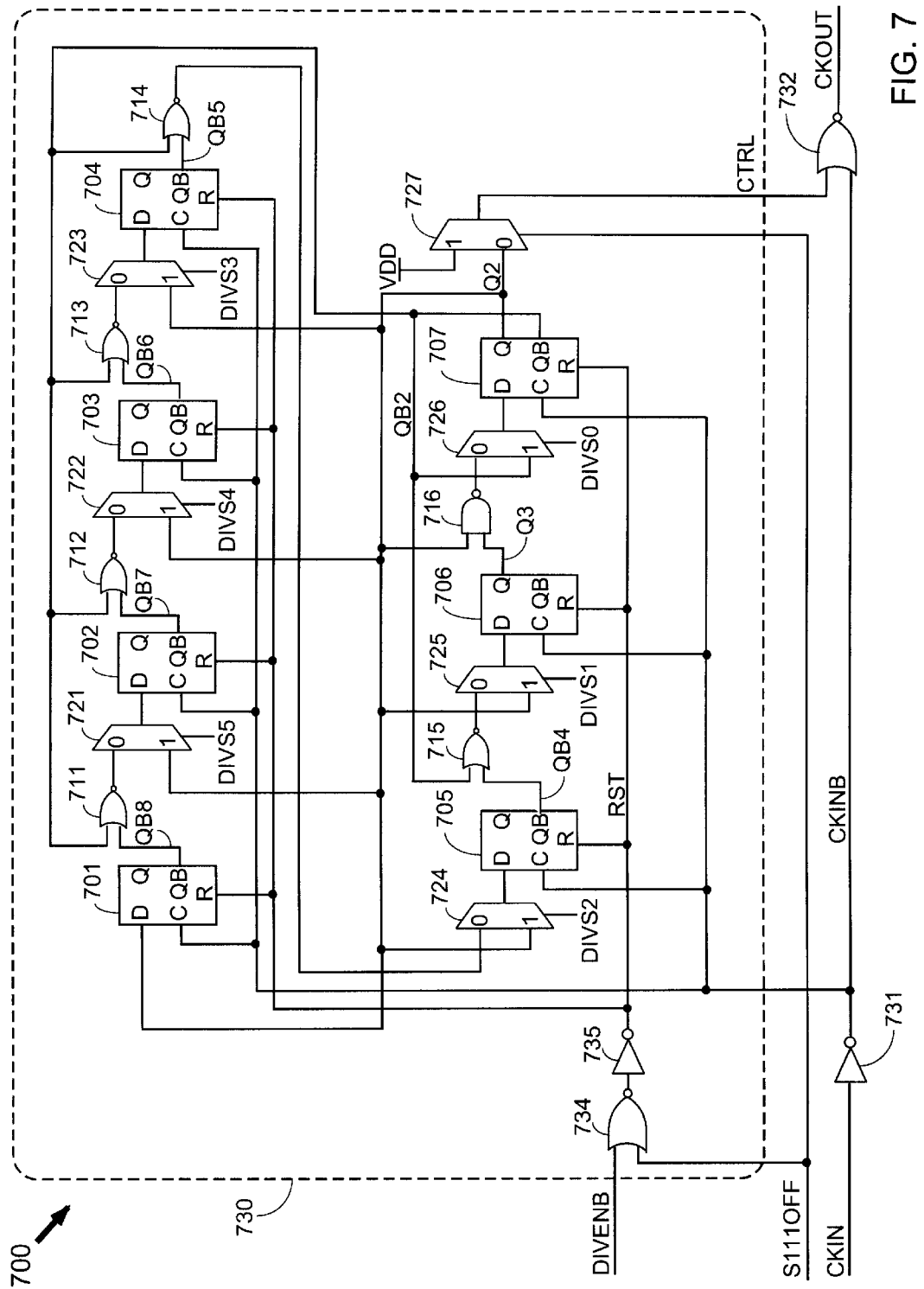
FIG. 7 is a circuit diagram of a divide-by-N clock divider circuit having a programmable divisor according to one embodiment of the invention.

FIG. 7 shows a clock divider circuit according to an embodiment of the invention that provides an additional capability, a programmable divisor. Clock divider circuit 700 of FIG. 7 resembles clock divider circuits 300, 400, and 500 of FIGS. 3–5, although as pictured in FIG. 7 the NOR scheme of FIG. 6 is used instead of the AND scheme of FIGS. 3–5. As previously described with regard to FIG. 6, the two schemes are interchangeable.

As in the other embodiments of the invention, logical NOR circuit 732 filters pulses on input clock signal CKIN, with a signal CTRL from a control circuit 730 controlling which pulses are passed to the output terminal CKOUT. The number of flip-flops coupled in series in control circuit 730 is determined by select signals DIVS5–DIVS0, which control respective multiplexers 721–726 to determine the active path through the flip-flop chain.

In the pictured embodiment, the divisor has a maximum value of eight. When a divisor of eight is selected, the flip-flop chain includes all seven flip-flops (701–707). When a divisor of seven is selected, the flip-flop chain includes six flip-flops (702–707), and so forth. Therefore, as in the other examples shown herein, the number of flip-flops in the chain is N−1, where N is the divisor.

In addition to select signals DIVS5–DIVS0, a select signal S111OFF allows a user to select a state in which the clock divider circuit is turned off. When signal S111OFF is high, multiplexer 727 passes a high value VDD to signal CTRL, which forces logical NOR circuit 732 to drive signal CKOUT low. In another embodiment (not shown), multiplexer 727 and signal S111OFF are not present. In yet another embodiment (not shown), signal S111OFF causes multiplexer 727 to pass a low value GND to signal CTRL, and output signal CKOUT simply echoes signal CKIN.

Table 2 shows the values of signals DIVENB, S111OFF, and DIVS5–DIVS0 that result in each supported circuit function. Table 3 shows one example of how the circuit function can be selected (i.e., how the select signal values can be encoded) using three values SRAM2–SRAM0. In some embodiments, these values are stored in memory cells. In one such embodiment, programmable clock divider circuit 700 forms at least a portion of a programmable logic device (PLD) such as a Field Programmable Gate Array (FPGA). In this embodiment, the values SRAM2–SRAM0 are stored in configuration memory cells that form a portion of a configuration memory array of the FPGA. In Tables 2 and 3, an "x" designates a "don't-care" value.

TABLE 2

| Function | DIV-ENB | S111-OFF | DIV-S5 | DIV-S4 | DIV-S3 | DIV-S2 | DIV-S1 | DIV-S0 |
|---|---|---|---|---|---|---|---|---|
| N = 1 | 1 | 0 | x | x | x | x | x | x |
| N = 2 | 0 | 0 | x | x | x | x | x | 1 |
| N = 3 | 0 | 0 | x | x | x | x | 1 | 0 |
| N = 4 | 0 | 0 | x | x | x | 1 | 0 | 0 |
| N = 5 | 0 | 0 | x | x | 1 | 0 | 0 | 0 |
| N = 6 | 0 | 0 | x | 1 | 0 | 0 | 0 | 0 |
| N = 7 | 0 | 0 | 1 | 0 | 0 | 0 | 0 | 0 |
| N = 8 | 0 | 0 | 0 | 0 | 0 | 0 | 0 | 0 |
| CKOUT = GND | x | 1 | x | x | x | x | x | x |

TABLE 3

| Function | SRAM2 | SRAM1 | SRAM0 |
|---|---|---|---|
| N = 1 | x | x | x |
| N = 2 | 0 | 0 | 0 |
| N = 3 | 0 | 0 | 1 |
| N = 4 | 0 | 1 | 0 |
| N = 5 | 0 | 1 | 1 |
| N = 6 | 1 | 0 | 0 |

TABLE 3-continued

| Function | SRAM2 | SRAM1 | SRAM0 |
|---|---|---|---|
| N = 7 | 1 | 0 | 1 |
| N = 8 | 1 | 1 | 0 |
| CKOUT = GND | 1 | 1 | 1 |

Clock divider circuit 700 includes a control circuit 730, an inverter 731, and a logical NOR circuit 732 (implemented in this embodiment as a 2-input NOR gate). The input clock signal CKIN drives inverter 731 to provide signal CKINB, which in turn drives NOR gate 732, which provides the output clock signal CKOUT. An output signal CTRL from control circuit 730 also drives NOR gate 732. In some embodiments (not shown), inverter 731 is omitted.

Control circuit 730 includes seven flip-flops 701–707, logical NOR circuits 711–715 (implemented in this embodiment as 2-input NOR gates), logical NAND circuit 716 (implemented in this embodiment as a 2-input NAND gate), and multiplexers 721–727. The clock terminal of each of flip-flops 701–707 is driven by signal CKINB.

Signal QB8, the QB (complement) data output of flip-flop 701, drives NOR circuit 711, as does signal QB2, the QB data output of flip-flop 707. NOR circuit 711 drives the "0" input of multiplexer 721, while the "1" input is driven by signal Q2, the Q (true) data output of flip-flop 707. Multiplexer 721 also has a select input terminal coupled to receive select signal DIVS5, and an output signal that drives the D data input of flip-flop 702.

Similarly, signal QB7, the QB data output of flip-flop 702, drives NOR circuit 712, as does signal QB2. NOR circuit 712 drives the "0" input of multiplexer 722, while the "1" input is driven by signal Q2. Multiplexer 722 also has a select input terminal coupled to receive select signal DIVS4, and an output signal that drives the D data input of flip-flop 703. Flip-flops 703–705, NOR circuits 713–715, and multiplexers 723–725 are similarly coupled together. The select inputs of multiplexers 723–725 are coupled to receive select signals DIVS3–DIVS1, respectively.

Multiplexer 725 drives the D data input terminal of flip-flop 706. Signal Q3, the Q data output of flip-flop 706, drives NAND circuit 716, as does signal Q2. NAND circuit 716 drives the "0" input of multiplexer 726, while the "1" input is driven by signal QB2. Multiplexer 726 also has a select input terminal coupled to receive select signal DIVS0, and an output signal that drives the D data input of flip-flop 707. Signal Q2 drives the "0" input of multiplexer 727, while the "1" input is coupled to power high VDD. The output of multiplexer 727 is the control circuit output signal CTRL.

In the embodiment of FIG. 7, all of the flip-flops have initialization input terminals, in this case reset terminals. (In other embodiments, some or all of the flip-flops have set initialization terminals, both set and reset initialization terminals, or no initialization terminals.) The reset input terminals are all coupled to receive a reset signal RST.

Signal RST is provided by ORing together divider enable signal DIVENB and select signal S111OFF (using NOR gate 734 followed by inverter 735). When either of these signals is high, signal RST goes high and all of the flip-flops are reset. Thus, signals Q2 and Q3 go low, while signals QB4–QB8 go high. Because a high value on select signal S111OFF causes multiplexer 727 to pass a high value to signal CTRL regardless of the state of the flip-flops, some embodiments do not include NOR gate 734 and inverter 735. In these embodiments, the initialization terminals of the flip-flops are driven by signal DIVENB. However, allowing signal S111OFF to disable the flip-flops reduces power consumption when this option is selected.

Assuming signal S111OFF is low, when signal DIVENB is high, reset signal RST is also high. Signal Q2 is low, and multiplexer 727 passes this low value to signal CTRL, and hence to NOR circuit 732. Thus, NOR circuit 732 merely passes the input clock signal CKIN to the output terminal CKOUT. When signal DIVENB goes low, the flip-flops respond to falling edges of clock signal CKIN (rising edges on clock signal CKINB) by changing state as dictated by the circuit connections shown in FIG. 7.

Figure 8:
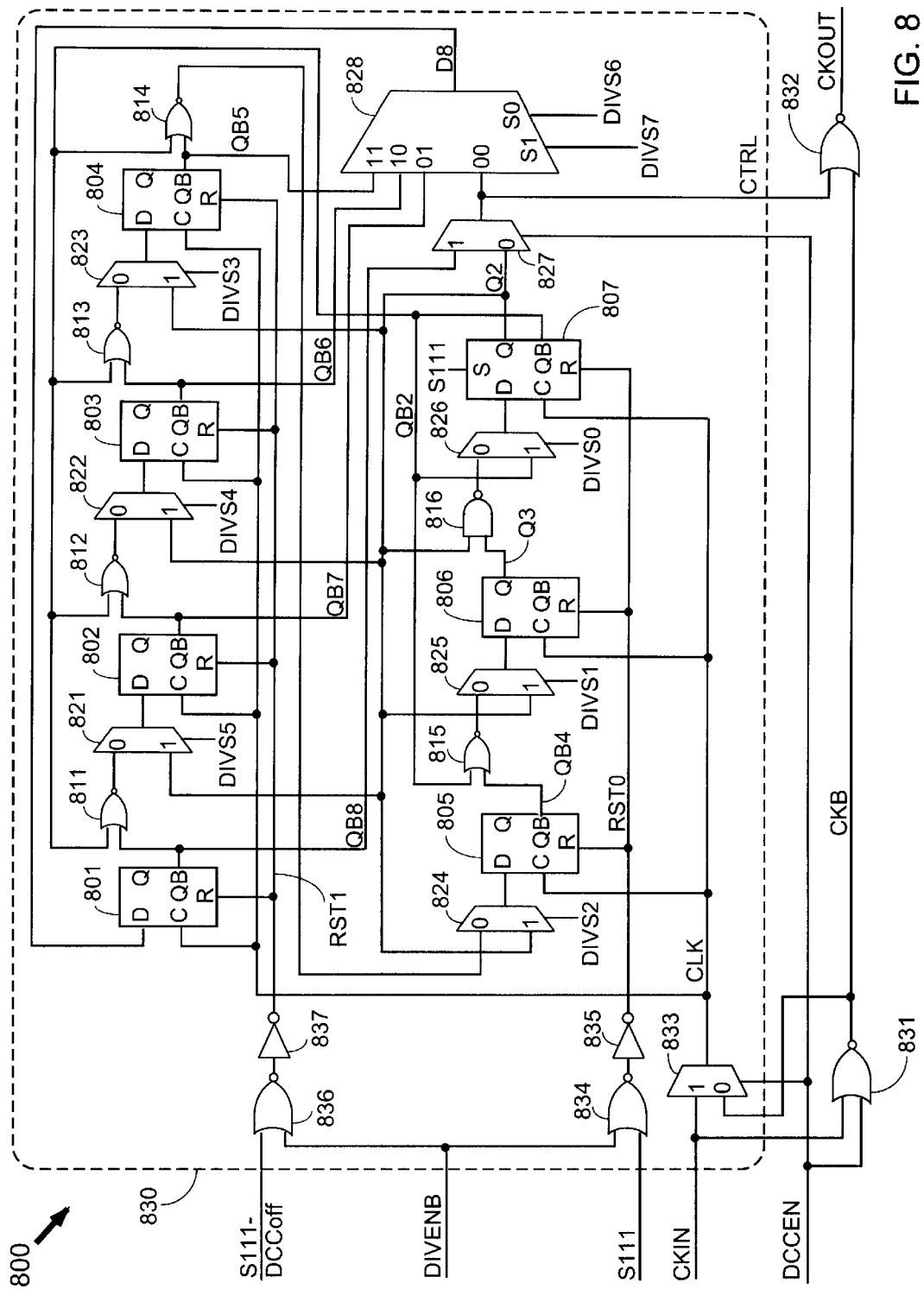
FIG. 8 is a circuit diagram of a divide-by-N clock divider circuit having a programmable divisor and optional duty cycle correction according to one embodiment of the invention.

FIG. 8 shows a clock divider circuit according to an embodiment of the invention that is similar to the embodiment of FIG. 7, but provides both a programmable divisor and optional duty cycle correction (DCC). Because of the similarity between the two figures, only the differences between the two embodiments are described in detail.

Note also that when a divisor of 4 is selected, the circuit of FIG. 8 is logically equivalent to the circuit of FIG. 6.

Clock divider circuit 800 includes several select signals in addition to those of clock divider circuit 700. Values of these signals for various circuit functions are shown in Table 4. As can be seen from Table 4, select signal S111 is high whenever the clock divider circuit is either performing in duty cycle correction mode, or providing a constant low output at terminal CKOUT. Select signal S111DCCoff is high whenever the clock divider circuit is providing a constant low output at terminal CKOUT. Select signal DCCEN is high whenever the clock divider circuit is performing in duty cycle correction mode. When duty cycle correction is enabled, select signals DIVS7 and DIVS6 control the size of the counter used to provide the duty-cycle-corrected clock signal.

Table 5 shows one example of how the circuit function can be selected (i.e., how the select signal values can be encoded) using four values SRAM3–SRAM0. In this embodiment, the value SRAM3 is the value of signal DCCEN. In some embodiments, these values are stored in memory cells. In one such embodiment, programmable clock divider circuit 800 forms at least a portion of a programmable logic device (PLD) such as a Field Programmable Gate Array (FPGA). In this embodiment, the values SRAM3–SRAM0 are stored in configuration memory cells that form a portion of a configuration memory array of the FPGA.

In Tables 4 and 5, an "x" is a "don't-care" value. In Table 5, when the values of SRAM2–SRAM0 are denoted as "Y Y Y", any combination of values is acceptable except all ones.

TABLE 4

| Function | DIV-ENB | S111 | S111 DCC-off | DIV-S7 | DIV-S6 | DIV-S5 | DIV-S4 | DIV-S3 | DIV-S2 | DIV-S1 | DIV-S0 |
|---|---|---|---|---|---|---|---|---|---|---|---|
| Without DCC (DCCEN is low): | | | | | | | | | | | |
| N = 1 | 1 | 0 | x | x | x | x | x | x | x | x | x |
| N = 2 | 0 | 0 | 0 | 0 | 0 | x | x | x | x | x | 1 |
| N = 3 | 0 | 0 | 0 | 0 | 0 | x | x | x | x | 1 | 0 |
| N = 4 | 0 | 0 | 0 | 0 | 0 | x | x | x | 1 | 0 | 0 |
| N = 5 | 0 | 0 | 0 | 0 | 0 | x | x | 1 | 0 | 0 | 0 |
| N = 6 | 0 | 0 | 0 | 0 | 0 | x | 1 | 0 | 0 | 0 | 0 |
| N = 7 | 0 | 0 | 0 | 0 | 0 | 1 | 0 | 0 | 0 | 0 | 0 |
| N = 8 | 0 | 0 | 0 | 0 | 0 | 0 | 0 | 0 | 0 | 0 | 0 |
| GND | x | 1 | 1 | x | x | x | x | x | x | x | x |
| With DCC (DCCEN is high): | | | | | | | | | | | |
| N = 2 | 0 | 1 | 0 | 0 | 0 | 0 | 0 | 0 | x | x | x |
| N = 4 | 0 | 1 | 0 | 0 | 1 | 0 | 0 | 0 | x | x | x |
| N = 6 | 0 | 1 | 0 | 1 | 0 | 0 | 0 | 0 | x | x | x |
| N = 8 | 0 | 1 | 0 | 1 | 1 | 0 | 0 | 0 | x | x | x |

TABLE 5

| Function | DIVENB | SRAM3 | SRAM2 | SRAM1 | SRAM0 |
|---|---|---|---|---|---|
| Without DCC (DCCEN is low): | | | | | |
| N = 1 | 1 | 0 | Y | Y | Y |
| N = 2 | 0 | 0 | 0 | 0 | 0 |
| N = 3 | 0 | 0 | 0 | 0 | 1 |
| N = 4 | 0 | 0 | 0 | 1 | 0 |
| N = 5 | 0 | 0 | 0 | 1 | 1 |
| N = 6 | 0 | 0 | 1 | 0 | 0 |
| N = 7 | 0 | 0 | 1 | 0 | 1 |
| N = 8 | 0 | 0 | 1 | 1 | 0 |
| CKOUT = GND | 0 | 0 | 1 | 1 | 1 |
| With DCC (DCCEN is high): | | | | | |
| N = 2 | 0 | 1 | 0 | 0 | x |
| N = 4 | 0 | 1 | 0 | 1 | x |
| N = 6 | 0 | 1 | 1 | 0 | x |
| N = 8 | 0 | 1 | 1 | 1 | x |

Clock divider circuit 800 differs from clock divider circuit 700 of FIG. 7 as follows. Flip-flop 807 has a reset initialization terminal coupled to signal RST0, as are the reset terminals of flip-flops 805–806. However, flip-flop 807 also has a set terminal, which overrides the reset terminal. In other words, if signal RST0 (which drives the reset terminal) and select signal S111 (which drives the set terminal) are both high at the same time, flip-flop 807 is set. Such flip-flops are well known in the art, therefore, flip-flop 807 is not further described herein. The reset terminals of flip-flops 801–804 are driven by a signal called RST1.

Signal RST0 is obtained by combining signals S111 and DIVENB in a logical OR circuit, implemented in this embodiment as a NOR gate 834 followed by an inverter 835. Similarly, signal RST1 is obtained by combining signals S111DCCoff and DIVENB in a logical OR circuit, implemented in this embodiment as a NOR gate 836 followed by an inverter 837.

Each of flip-flops 801–807 is clocked by a clock signal CLK, which is obtained by selecting between signals CKIN and CKB using multiplexer 833. If signal DCCEN is high, signal CKIN is passed to node CLK. If signal DCCEN is low, signal CKB is passed to node CLK. Signal CKB is obtained by NORing together signals DCCEN and CKIN, in this embodiment using a NOR gate 831.

A 4-to-1 multiplexer 828 forms part of a feedback path from the output of multiplexer 827 to the data input terminal of flip-flop 801. Multiplexer 828 is controlled by select signals DIVS7 and DIVS6 and provides signal D8 to the D data input terminal of flip-flop 801. When signals DIVS7–6 have the values 0-0, signal D8 is the output of multiplexer 827. When signals DIVS7–6 have the values 0-1, signal D8 is the QB (complement) output of flip-flop 802 (QB7). When signals DIVS7–6 have the values 1-0, signal D8 is the QB output of flip-flop 803 (QB6). When signals DIVS7–6 have the values 1-1, signal D8 is the QB output of flip-flop 804 (QB5). Thus, by selecting the appropriate values for signals DIVS7 and DIVS6, the length of the DCC flip-flop chain (i.e., the size of the resulting counter) is determined.

Those having skill in the relevant arts of the invention will now perceive various modifications and additions that can be made as a result of the disclosure herein. For example, logical NAND circuits, NAND gates, logical AND circuits, logical NOR circuits, NOR gates, inverters, flip-flops, reset flip-flops, set/reset flip-flops, multiplexer circuits, and other components other than those described herein can be used to implement the invention.

For example, a logical NAND circuit can be implemented as a NAND gate or as a NOR gate with inverted input and output signals; a logical NOR circuit can be implemented as a NOR gate or as a NAND circuit with inverted input and output signals; a logical AND circuit can be implemented as a NAND gate with an inverted output signal or as a NOR gate with inverted input signals; and so forth. Such substitutions are well known in the relevant arts.

Further, active-high signals can be replaced with active-low signals by making straightforward alterations to the circuitry, such as are well known in the art of circuit design. True and complement flip-flop data output signals can be used interchangeably by making straightforward alterations to the circuitry, such as are well known in the relevant arts.

Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A divide-by-N clock divider circuit, comprising:
   a clock input terminal;
   a clock output terminal;
   a first logical NOR circuit having a first input terminal coupled to the clock input terminal of the clock divider circuit, a second input terminal, and an output terminal coupled to the clock output terminal of the clock divider circuit; and
   a control circuit comprising N−1 flip-flops coupled in series, each flip-flop having a clock terminal coupled to the clock input terminal of the clock divider circuit, each flip-flop having a data input terminal and a data output terminal, the data output terminal of each flip-flop except a last flip-flop being coupled to the data input terminal of a succeeding flip-flop in the series, the last flip-flop in the series having a data output terminal coupled to a data input terminal of a first flip-flop in the series and further coupled to the second input terminal of the first logical NOR circuit.

2. The clock divider circuit of claim 1, wherein the value of N is one of a group of values consisting of three, four, and five.

3. The clock divider circuit of claim 1, further comprising an inverter coupled between the clock input terminal of the clock divider circuit and the clock terminal of each flip-flop, and further coupled between the clock input terminal of the clock divider circuit and the first input terminal of the first logical NOR circuit.

4. The clock divider circuit of claim 1, wherein:
   the clock divider circuit further comprises a divider enable input terminal; and
   each flip-flop comprises an initialization input terminal coupled to the divider enable input terminal.

5. The clock divider circuit of claim 4, wherein the initialization input terminal of each flip-flop is a reset terminal.

6. The clock divider circuit of claim 1, wherein the N−1 flip-flops include the first flip-flop, a next flip-flop, and the last flip-flop, the control circuit further comprising:
   a logical AND circuit having input terminals coupled to the data output terminals of the first and last flip-flops, and further having an output terminal coupled to the data input terminal of the next flip-flop; and
   a logical NAND circuit having input terminals coupled to the data output terminals of the next and last flip-flops, and further having an output terminal coupled to the data input terminal of the last flip-flop.

7. The clock divider circuit of claim 1, wherein the control circuit further comprises a logical NAND circuit coupled between the first and last flip-flops, the logical NAND circuit having a first input terminal coupled to the data output terminal of the first flip-flop, a second input terminal coupled to the data output terminal of the last flip-flop, and an output terminal coupled to the data input terminal of the last flip-flop.

8. The clock divider circuit of claim 7, wherein:
   the control circuit further comprises a logical AND circuit and a next flip-flop coupled between the first flip-flop and the logical NAND circuit;
   the logical AND circuit has a first input terminal coupled to the data output terminal of the first flip-flop, a second input terminal coupled to the data output terminal of the last flip-flop, and an output terminal; and
   the next flip-flop has a data input terminal coupled to the output terminal of the logical AND circuit and a data output terminal coupled to the first input terminal of the logical NAND circuit.

9. The clock divider circuit of claim 1, wherein the N−1 flip-flops include the first flip-flop, a next flip-flop, and the last flip-flop, the first and last flip-flops each further having an inverse output terminal, the control circuit further comprising:
   a second logical NOR circuit having a first input terminal coupled to the inverse output terminal of the first flip-flop, a second input terminal coupled to the inverse output terminal of the last flip-flop, and an output terminal coupled to the data input terminal of the next flip-flop; and
   a logical NAND circuit having input terminals coupled to the data output terminals of the next and last flip-flops, and further having an output terminal coupled to the data input terminal of the last flip-flop.

10. The clock divider circuit of claim 1, further comprising:
    a duty cycle correction enable input terminal;
    a counter circuit having a clock input terminal coupled to the clock input terminal of the clock divider circuit and further having an output terminal; and
    a multiplexer circuit coupled between the last flip-flop and the first logical NOR circuit, the multiplexer circuit having a first input terminal coupled to the output terminal of the counter circuit, a second input terminal coupled to the data output terminal of the last flip-flop, an output terminal coupled to the second input terminal of the first logical NOR circuit, and a select terminal coupled to the duty cycle correction enable input terminal of the clock divider circuit.

11. The clock divider circuit of claim 10, wherein the counter circuit is a Gray code counter circuit.

12. A clock divider circuit having a programmable divisor, comprising:
    a clock input terminal;
    a clock output terminal;
    a divisor select input terminal;
    a first logical NOR circuit having a first input terminal coupled to the clock input terminal of the clock divider circuit, a second input terminal, and an output terminal coupled to the clock output terminal of the clock divider circuit; and
    a programmable control circuit, comprising:
       a plurality of flip-flops coupled in series and including a first flip-flop and a last flip-flop, each flip-flop having a clock terminal coupled to the clock input terminal of the clock divider circuit, each flip-flop having a data input terminal and a data output terminal, the data output terminal of each flip-flop except the last flip-flop being coupled to the data input terminal of a succeeding flip-flop in the series, the data output terminal of the last flip-flop being coupled to the data input terminal of the first flip-flop and further being coupled to the second input terminal of the first logical NOR circuit; and
       a multiplexer circuit having a first input terminal coupled to the data output terminal of the last flip-flop, a second input terminal coupled to the data output terminal of a flip-flop in the series other than the last flip-flop, an output terminal coupled to the data input terminal of the last flip-flop, and a select terminal coupled to the divisor select input terminal of the clock divider circuit.

13. The clock divider circuit of claim 12, wherein the clock divider circuit forms at least a portion of a programmable logic device (PLD), the clock divider circuit further comprising a memory cell of the PLD coupled to the divisor select input terminal.

14. The clock divider circuit of claim 13, wherein the PLD is a Field Programmable Gate Array (FPGA), and the memory cell forms a portion of a configuration memory array of the FPGA.

15. A clock divider circuit, comprising:

a clock input terminal;

a clock output terminal;

a plurality of flip-flops including a first flip-flop and a last flip-flop, each flip-flop having a data input terminal, a data output terminal, and a clock terminal coupled to the clock input terminal of the clock divider circuit, the data output terminal of the last flip-flop being coupled to the data input terminal of the first flip-flop;

a logical NAND circuit having a first input terminal coupled to the data output terminal of the first flip-flop, a second input terminal coupled to the data output terminal of the last flip-flop, and an output terminal coupled to the data input terminal of the last flip-flop; and a logical NOR circuit having a first input terminal coupled to the clock input terminal of the clock divider circuit, a second input terminal coupled to the data output terminal of the last flip-flop, and an output terminal coupled to the clock output terminal of the clock divider circuit.

16. The clock divider circuit of claim 15, further comprising a logical AND circuit and a next flip-flop coupled between the first flip-flop and the logical NAND circuit, wherein:

the logical AND circuit has a first input terminal coupled to the data output terminal of the first flip-flop, a second input terminal coupled to the data output terminal of the last flip-flop, and an output terminal; and the next flip-flop has a data input terminal coupled to the output terminal of the logical AND circuit, a clock terminal coupled to the clock input terminal of the clock divider circuit, and a data output terminal coupled to the first input terminal of the logical NAND circuit.

17. The clock divider circuit of claim 15, wherein:

the clock divider circuit further comprises a divider enable input terminal; and each of the plurality of flip-flops comprises an initialization input terminal coupled to the divider enable input terminal.

18. The clock divider circuit of claim 17, wherein the initialization input terminal of each flip-flop is a reset terminal.

19. A clock divider circuit, comprising:

a clock input terminal;

a clock output terminal;

a plurality of flip-flops including a first flip-flop, a next flip-flop, and a last flip-flop, each flip-flop having a data input terminal, a data output terminal, and a clock terminal coupled to the clock input terminal of the clock divider circuit, the data output terminal of the last flip-flop being coupled to the data input terminal of the first flip-flop;

a logical AND circuit having input terminals coupled to the data output terminals of the first and last flip-flops, and further having an output terminal coupled to the data input terminal of the next flip-flop;

a logical NAND circuit having input terminals coupled to the data output terminals of the next and last flip-flops, and further having an output terminal coupled to the data input terminal of the last flip-flop; and a logical NOR circuit having a first input terminal coupled to the clock input terminal of the clock divider circuit, a second input terminal coupled to the data output terminal of the last flip-flop, and an output terminal coupled to the clock output terminal of the clock divider circuit.

20. The clock divider circuit of claim 19, wherein the plurality of flip-flops includes three flip-flops, and the clock divider circuit is a divide-by-four circuit.

21. The clock divider circuit of claim 19, wherein the plurality of flip-flops includes four flip-flops, and the clock divider circuit is a divide-by-five circuit.

22. The clock divider circuit of claim 19, further comprising an inverter coupled between the clock input terminal of the clock divider circuit and the clock terminal of each flip-flop, and further coupled between the clock input terminal of the clock divider circuit and the first input terminal of the logical NOR circuit.

23. The clock divider circuit of claim 19, wherein:

the clock divider circuit further comprises a divider enable input terminal; and each of the plurality of flip-flops comprises an initialization input terminal coupled to the divider enable input terminal.

24. The clock divider circuit of claim 23, wherein the initialization input terminal of each flip-flop is a reset terminal.

25. A clock divider circuit, comprising:

a clock input terminal;

a clock output terminal;

a plurality of flip-flops including a first flip-flop, a next-flip-flop, and a last flip-flop, each flip-flop having a data input terminal and a clock terminal coupled to the clock input terminal of the clock divider circuit, the first flip-flop having an inverse output terminal, the next flip-flop having a true output terminal, and the last flip-flop having true and inverse output terminals, the true output terminal of the last flip-flop being coupled to the data input terminal of the first flip-flop;

a first logical NOR circuit having a first input terminal coupled to the inverse output terminal of the first flip-flop, a second input terminal coupled to the inverse output terminal of the last flip-flop, and an output terminal coupled to the data input terminal of the next flip-flop;

a logical NAND circuit having input terminals coupled to the true output terminals of the next and last flip-flops, and further having an output terminal coupled to the data input terminal of the last flip-flop; and a second logical NOR circuit having a first input terminal coupled to the clock input terminal of the clock divider circuit, a second input terminal coupled to the true output terminal of the last flip-flop, and an output terminal coupled to the clock output terminal of the clock divider circuit.

26. The clock divider circuit of claim 25, wherein the plurality of flip-flops includes three flip-flops, and the clock divider circuit is a divide-by-four circuit.

27. The clock divider circuit of claim 25, wherein the plurality of flip-flops includes four flip-flops, and the clock divider circuit is a divide-by-five circuit.

28. The clock divider circuit of claim 25, further comprising an inverter coupled between the clock input terminal of the clock divider circuit and the clock terminal of each flip-flop, and further coupled between the clock input terminal of the clock divider circuit and the first input terminal of the second logical NOR circuit.

29. The clock divider circuit of claim 25, wherein:

the clock divider circuit further comprises a divider enable input terminal; and each of the plurality of flip-flops comprises an initialization input terminal coupled to the divider enable input terminal.

30. The clock divider circuit of claim 29, wherein the initialization input terminal of each flip-flop is a reset terminal.

* * * * *